United States Patent [19]

Robinson et al.

[11] Patent Number: 4,512,284
[45] Date of Patent: Apr. 23, 1985

[54] GLOW DISCHARGE APPARATUS FOR USE IN COATING A DISC-SHAPED SUBSTRATE

[75] Inventors: John W. Robinson, Levittown, Pa.; Grzegorz Kaganowicz, Belle Meade, N.J.

[73] Assignee: RCA Corporation, Princeton, N.J.

[21] Appl. No.: 563,230

[22] Filed: Dec. 19, 1983

[51] Int. Cl.³ .............................................. C23C 13/08
[52] U.S. Cl. ................................... 118/723; 118/730; 118/728; 118/50.1; 427/39; 427/47; 313/619
[58] Field of Search .................... 427/47, 39; 118/723, 118/730, 50.1, 722, 728; 313/619; 422/186.01, 186.03

[56] References Cited

U.S. PATENT DOCUMENTS

| | | |
|---|---|---|
| 4,046,660 | 9/1977 | Fraser . |
| 4,328,646 | 5/1982 | Kaganowicz . |
| 4,361,595 | 11/1982 | Koganowicz et al. ............... 427/39 |
| 4,369,205 | 1/1983 | Winterling et al. ................... 427/47 |
| 4,370,217 | 1/1983 | Funaki . |
| 4,400,410 | 8/1983 | Green et al. . |
| 4,430,361 | 2/1984 | Robinson et al. ..................... 427/39 |
| 4,431,505 | 2/1984 | Morrison, Jr. ....................... 204/298 |
| 4,440,107 | 4/1984 | Doehler et al. ....................... 427/47 |

FOREIGN PATENT DOCUMENTS 121629  9/1981  Japan .................................... 427/47

OTHER PUBLICATIONS

"Thin Film Processes", J. L. Vossen, W. Kern; 1978; pp. 134-146 and pp. 338-339.
"Room Temperature Glow Discharge Deposition of Silicon Oxides from $SiH_4$ and $N_2O$", Kaganowicz, Ban and Robinson, 1983.

Primary Examiner—John D. Smith
Assistant Examiner—Bernard F. Plantz
Attorney, Agent, or Firm—Birgit E. Morris; Theodore R. Furman

[57] ABSTRACT

An improved apparatus for preparing a coating by subjecting gaseous reactant precursors to a glow discharge is disclosed. The improvement comprises an electrode which is larger in all dimensions than the substrate which is to be coated. Electrically insulated magnets are arranged such that the area of the magnets is proportionally distributed with respect to the area of the substrate to be coated, whereby enhanced uniformity of quality and thickness of the deposited coating are provided. Unexpectedly the coating deposition rate increases substantially without increasing the power required or precursor consumption, and further, the temperature does not markedly increase during deposition.

10 Claims, 5 Drawing Figures

GLOW DISCHARGE APPARATUS FOR USE IN COATING A DISC-SHAPED SUBSTRATE

This invention relates to an apparatus for depositing a coating onto a substrate by glow discharge. More particularly, the invention relates to an improved electrode used in such an apparatus.

BACKGROUND OF THE INVENTION

Kaganowicz, in U.S. Pat. No. 4,328,646, disclosed a method for preparing an abrasive silicon oxide ($SiO_x$) coating on a plastic substrate, such as a patterned lapping disc, which includes the steps of subjecting silane and a gaseous, oxygen-containing compound to a glow discharge. The resulting abrasive $SiO_x$ coatings deposited on the substrate are suitable for lapping a hard material, such as diamond.

Abrasive coated discs of the type mentioned above have been successfully employed to micromachine diamond articles of micron and sub-micron dimensions, such as styli for high density information discs. In order to meet the stringent specifications of a high density information disc playback system, the diamond styli must be machined to a high degree of accuracy. It has been found that uniformity of quality and thickness of the $SiO_x$ coating on the stylus lapping disc is important to the successful manufacture of video disc styli.

Many commercially available glow discharge systems suitable for depositing $SiO_x$ coatings onto lapping disc substrates employ electrodes which are smaller in area than a typical stylus lapping disc (30.5 cm in diameter). To adapt to such a system, the lapping disc substrate is mounted parallel to the electrodes so that the disc can be rotated through the electrode area in order to coat the entire substrate surface with the product deposited during the glow discharge. Because it is known that coatings of different quality and thickness are deposited in different areas of a glow discharge system, magnets have been added to, but electrically insulated from, the electrodes. The magnets keep the glow in the electrode area, thereby providing somewhat better uniformity of the deposited coatings. However, the variations across a substrate with respect to uniformity of thickness and quality of $SiO_x$ coatings deposited on the lapping disc in this manner, although improved, are still less than desirable for the highly precise manufacture of the above described styli. Also, when using an electrode smaller than the substrate, if a higher power is sought to be used to promote a more rapid deposition, heat builds up in the system which warps the plastic substrates. Merely enlarging state of the art electrodes to be comparable in size to the lapping disc substrate does not enhance the uniformity of the deposit.

It should be stressed that the desired improvements in the uniformity of quality and thickness of a coating across the substrate should not be obtained at the expense of established standards for the production of stylus lapping discs, if possible. Factors such as power usage, $SiO_x$ precursor consumption and deposition rate are important economic considerations. Further, the temperature in the system should be minimized as a practical matter to avoid damaging the heat-sensitive plastic substrates used in the production of lapping discs.

SUMMARY OF THE INVENTION

An improved apparatus for preparing a coating by subjecting gaseous precursors to a glow discharge is disclosed. The improvement comprises an electrode which is larger in all dimensions than the substrate which is to be coated. Electrically insulated magnets are arranged such that the area of the magnets is proportionally distributed with respect to the area of the substrate to be coated, whereby enhanced uniformity of quality and thickness of the deposited coating are provided. Unexpectedly, the coating deposition rate increases substantially without increasing the power required or precursor consumption, and further, the temperature does not markedly increase during deposition.

DETAILED DESCRIPTION OF THE INVENTION

Figures 1, 5:
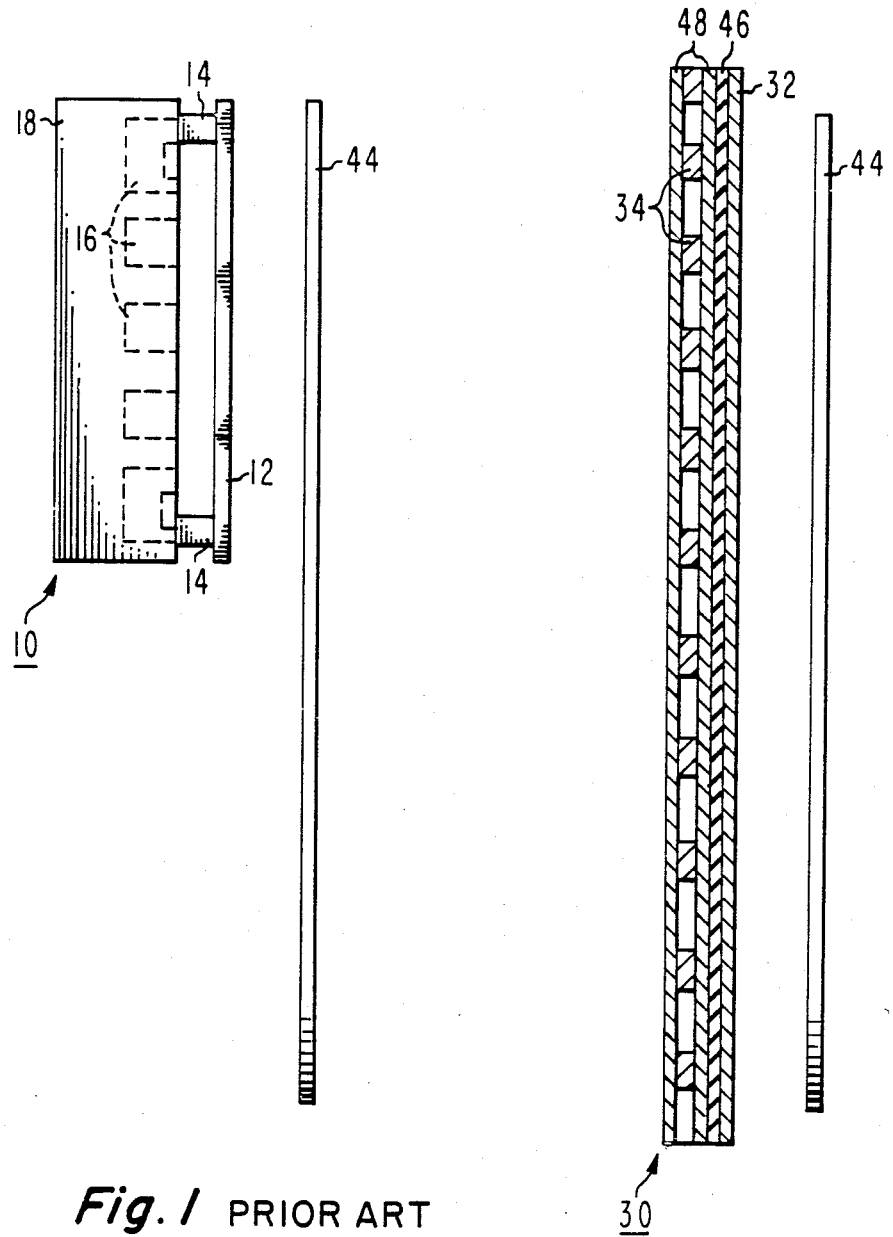
FIG. 1 is a cross-sectional view of an electrode used in the prior art glow discharge systems.
FIG. 5 is a cross-sectional view of an electrode used in the glow discharge apparatus of the present invention.

FIG. 1 is a cross-sectional view of a prior art electrode assembly 10 and a substrate 44 which is to be coated. The prior art electrode assembly 10 comprises an electrode 12 separated from a magnet compartment 18 containing magnets 16 by insulators 14. The prior art electrode assembly 10 measures about 12 cm wide by 15 cm high by 6 cm deep.

Figure 2:
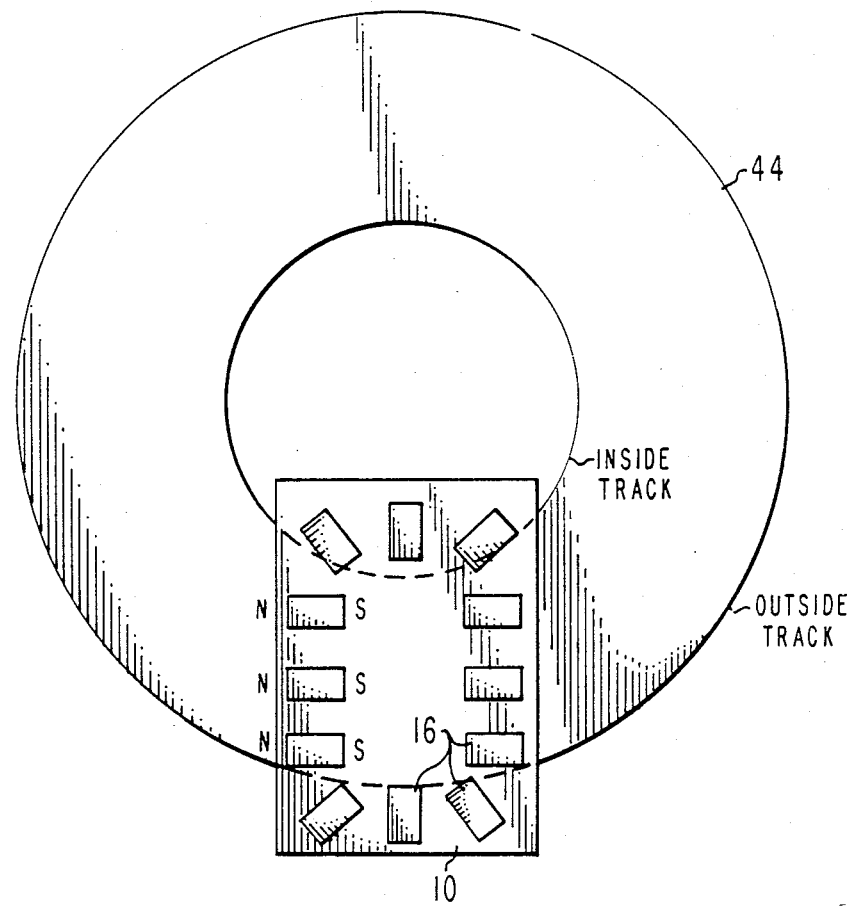
FIG. 2 is a lateral view illustrating the size of an electrode and arrangement of magnets with respect to the substrate to be coated in a prior art glow discharge apparatus.

FIG. 2 is a lateral view of a prior art electrode assembly 10 showing the placement of the assembly 10 and the arrangement of the magnets 16 in relation to the substrate 44 to be coated. Although the substrate 44 is rotated, at any given instant approximately 25% of the inside track is within the electrode area compared to only about 10% of the outside track. This causes coatings of $SiO_x$ deposited along the inside track to be as much as 40% thicker than coatings deposited on other areas of the substrate 44.

Figure 3:
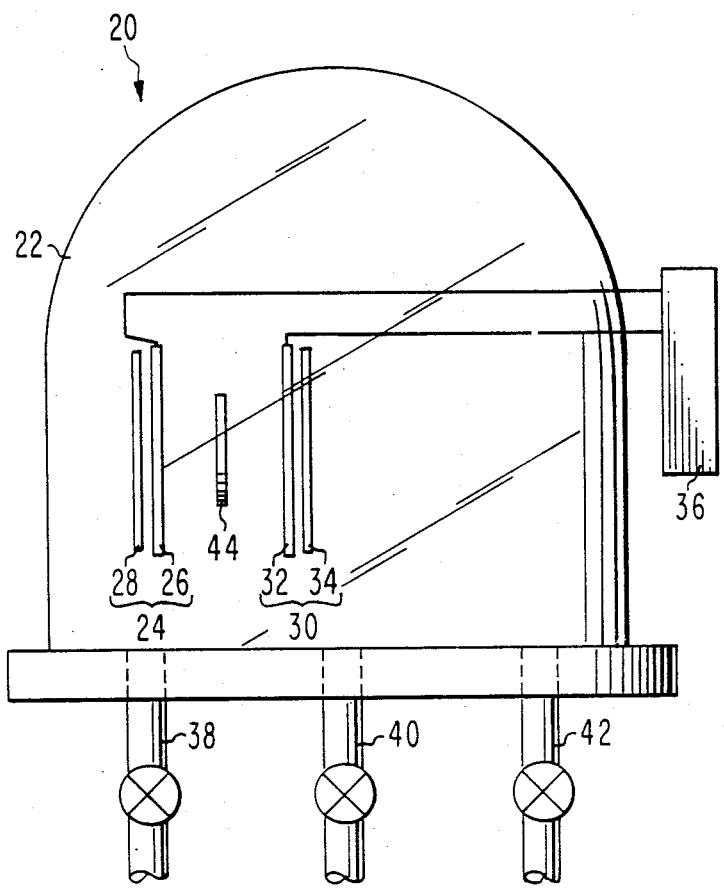
FIG. 3 is a cross-sectional view of an apparatus suitable for depositing a glow discharge coating according to the present invention.

A glow discharge apparatus of the present invention is shown in FIG. 3 generally as 20. The glow discharge apparatus 20 includes a vacuum chamber 22, which can be a glass bell jar. In the vacuum chamber 22 are two electrodes 26 and 32 which can be a screen, coil or plate of a material that is a good electrical conductor and does not readily sputter, such as aluminum. The electrodes 26 and 32 are connected to a power supply 36, which may be DC or AC, to produce a voltage potential. Behind the electrodes 26 and 32 are magnets 28 and 34. These magnets 28 and 34 are typically electrically insulated from the electrodes 26 and 32. The magnets 28 and 34 are typically behind the electrodes 26 and 32 but can be placed in any location where they would keep the glow in the vicinity of the electrodes 26 and 32 without interfering with deposition. The electrodes 26 and 32 and the magnets 28 and 34 make up the electrode assemblies 24 and 30. An outlet 38 from the vacuum chamber 22 allows for evacuation of the system and is connected to a pumping station, not shown. A first inlet 40 and a second inlet 42 are connected to gas bleed systems, not shown, for adding the reactants employed to prepare the glow discharge deposited coatings.

In order to begin deposition of a coating on the substrate 44, a glow discharge is initiated between the electrodes 26 and 32 by energizing the power source 36. For deposition the current should be in the range of about 200 to 900 milliamps, preferably about 400 to 700 milliamps. Any convenient frequency may be employed. The potential between electrodes 26 and 32 is generally about 1,000 volts. The magnets 28 and 34, along with the energized electrodes 26 and 32, create an electromagnetic field which keeps the glow in the vicinity of the electrodes 26 and 32 for a more efficient reaction of the precursors. As the precursors react in the glow, the coating is deposited onto the substrate. The power for the glow is maintained until the desired thickness has been deposited.

Figure 4:
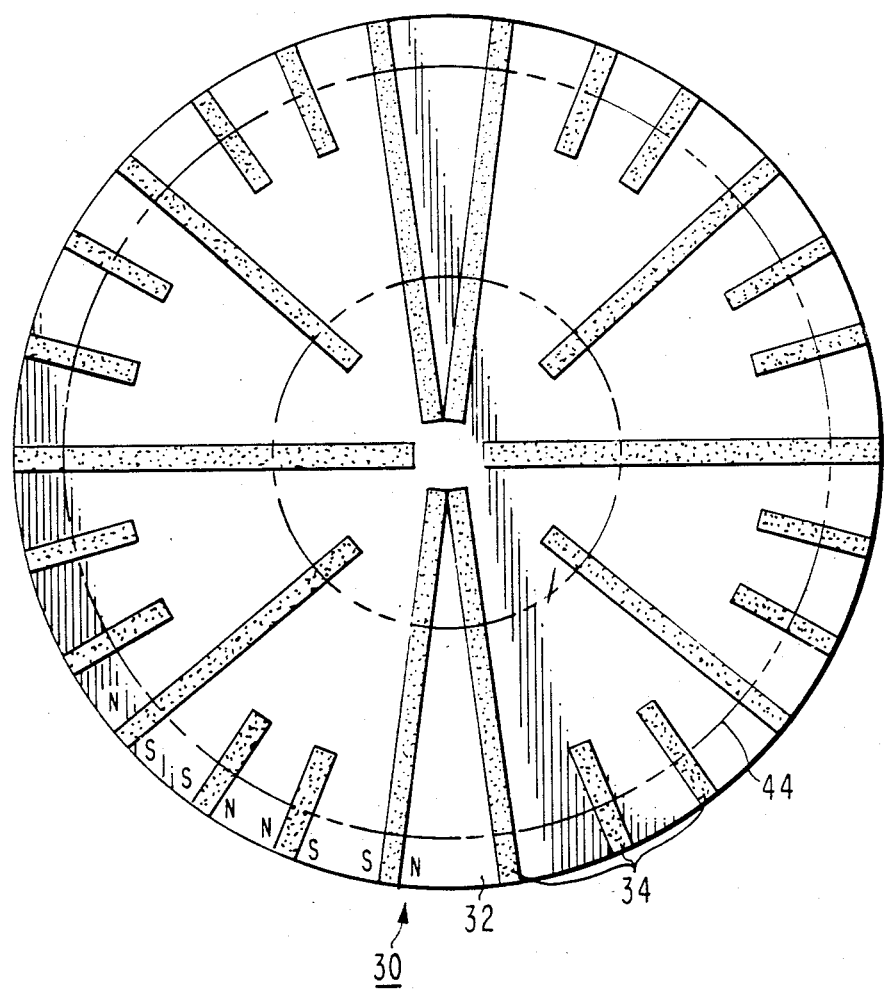
FIG. 4 is a lateral view illustrating the size of an electrode and an arrangement of magnets with respect to a substrate to be coated according to the present invention.

FIG. 4, in accordance with the present invention, shows the spacial and dimensional relationship of an improved electrode assembly 30 to a superimposed substrate 44 (shown with dotted lines). FIG. 4 also illustrates an arrangement of magnets wherein the area of the magnets 34 is distributed in a substantially proportional manner with respect to the area of the substrate 44. The substantially proportional arrangement of magnets 34 in the electrode assembly 30 of the present invention can be effectively accomplished by positioning the magnets 34 along the circumference of the electrode assembly 30. As shown in FIG. 4, the magnets 34 extend by varying lengths toward the center of the electrode assembly 30. A glow created between the electrode assembly 30 and the substrate 44 will be more evenly distributed over the substrate 44 by the magnets 34. Uniformity of the coating is further improved by rotating the substrate when coating a round substrate 44 using a round electrode assembly 30.

It should be stressed that although the embodiment in FIG. 4 contemplates a round substrate 44 and a round electrode assembly 30, the concept of the present invention is readily adaptable to other shapes. For example, to coat a square substrate, one should use a square electrode assembly larger than the substrate. Also, magnets should be arranged around the perimeter of the square electrode extending towards the center. The lengths of the magnets should vary so as to provide a substantially proportional distribution of magnet area with respect to the area of the substrate to be coated.

In utilizing the improved electrode assembly 30 as shown in FIG. 4, the uniformity of quality (as measured by refractive index) and thickness of deposited coatings across the substrate are substantially improved. With electrode assembly 30 being significantly larger than prior art electrodes, it was expected that the power and amount of precursors would have to be increased substantially beyond that used in prior art methods, in order to initiate a glow. Surprisingly, however, a glow was initiated using the present apparatus with no increase in power or the amount of precursors, and the deposition rate of the coating substantially increased. Further, the temperature of the substrate during deposition was considerably lower than in prior art depositions, offering more protection to heat-sensitive substrates and providing more flexibility of the power and time variables during deposition.

FIG. 5 is a cross-sectional view of a typical embodiment of an electrode assembly 30 of the present invention and its relationship to a substrate 44. The electrode 32, a non-sputtering, good electrical conductor, such as aluminum, can be connected to the power supply (not shown) by any convenient means. The electrode 32 is electrically insulated from the magnets 34 by an insulator 46, which can be of any suitable electrically insulating material such as glass or quartz. As a convenient means of holding the arrangement of magnets 34 in place, support plates 48 are used to "sandwich" the magnets 34. The support plates 48 can be of any material which does not readily sputter, such as aluminum. A suitable electrode assembly 30 is about 35 cm in diameter and only about 1.5 cm in thickness.

The invention will be further illustrated by the following Example but it should be understood that the invention is not meant to be limited to the details described therein.

EXAMPLE 1

A grooved polyvinyl chloride disc substrate, 30.5 cm in diameter, was charged to a glow discharge system parallel to, and about 5 cm from, an electrode assembly consisting of a 0.32 cm thick by 35 cm diameter aluminum electrode with a magnet arrangement sandwiched between two 0.32 cm × 35 cm aluminum support plates behind the electrode. The sandwiched magnets were separated from the electrode by a 0.32 cm × 30 cm glass insulator as shown in FIG. 5. The assembly was held together with nylon screws. The magnet arrangement consisted of six 15 cm long magnets, four 12 cm long magnets, and sixteen 4 cm long magnets equally spaced around the circumference of the electrode assembly, extending towards its center, as shown in FIG. 4. The system was evacuated to $10^{-5}$ Torr. $N_2O$ was introduced at a flow rate of 170 sccm, and $SiH_4$ was introduced at a flow rate of 25 sccm, to a pressure of 45 microns. A glow was initiated by applying 300 watts of RF power (at 13.56 MHz) to the electrode. The glow was maintained for 100 seconds. Thickness and refractive index of the deposited coating were measured at 20 points along a line spaced 5 cm from the outer edge of the substrate. The results are summarized in TABLE 1.

CONTROL

Using a prior art electrode of the type illustrated in FIGS. 1 and 2, a grooved polyvinyl chloride disc was processed as in Example 1, except that after 100 seconds the glow was shut off to allow the substrate to cool off. A second 100 seconds of glow was required to get the desired 1000 Angstrom thickness of $SiO_x$. Thickness and refractive index were measured at 20 points across the disc as in Example 1. The results are summarized in TABLE 1.

TABLE 1

|  | Average Coating Thickness | Average Refractive Index | Deposition Time | Deposition Rate | Electrode Temperature After Deposition |
|---|---|---|---|---|---|
| Example 1 | 1135Å (±50Å) | 1.421 (±.003) | 100 sec. | 681Å/minute | ~25°C. |

TABLE 1-continued

| | Average Coating Thickness | Average Refractive Index | Deposition Time | Deposition Rate | Electrode Temperature After Deposition |
|---|---|---|---|---|---|
| Control | 980Å (±200Å) | 1.396 (±.009) | 200 sec. | 294Å /minute | ~95° C. |

While the present invention has been described with respect to silicon oxide deposition by glow discharge onto a disc-shaped substrate using a round electrode assembly, it it not appropriate to so limit the scope of the concepts described therein. Uniformity of any product deposited by glow discharge can be enhanced by using the improved glow discharge electrode assembly of the present invention. Further, variously shaped substrates could be more uniformly coated by using the present electrode assembly.

What is claimed is:

1. In a magnetically enhanced glow discharge apparatus for use in coating a substrate, which apparatus comprises
   a vacuum chamber including an outlet means for evacuating said chamber and an inlet means for introducing appropriate reactant precursors into said chamber;
   at least one electrode assembly within said chamber connected to a power source, which assembly comprises an electrode which has a diameter greater than that of the substrate and magnets, electrically insulated from said electrode but arranged in such proximity to said electrode that a magnetic field created by said arrangement holds the glow between the electrode and the substrate without interfering with deposition onto the substrate; and
   means for holding the substrate parallel to, but apart from, said electrode;
   the improvement comprising that the magnets are arranged in a quasi-radial fashion provided by disposing magnets of varying length within the perimeter of the electrode assembly extending toward the center of said assembly, and so that the area of the magnets is distributed in a substantially proportional manner with respect to the area of the substrate to be coated, whereby a more uniform coating at a lower temperature and higher description rate is deposited.

2. The apparatus of claim 1 wherein the magnet arrangement is supported by two support plates of a material that will not readily sputter.

3. The apparatus of claim 1 wherein the arrangement of magnets is behind and parallel to the electrode of the electrode assembly.

4. The apparatus of claim 1 wherein two electrode assemblies are provided on either side of the substrate in order to coat both sides of a substrate.

5. The apparatus of claim 1 wherein the electrode assembly is disc-shaped so as to accommodate disc-shaped substrates.

6. The apparatus of claim 5 wherein means for rotating the disc-shaped substrate is provided.

7. In an electrode assembly for use in a glow discharge system, which electrode assembly comprises an electrode having a diameter greater than that of a substrate to be coated in the glow discharge system, and magnets, electrically insulated from said electrode but arranged in such proximity to said electrode that a magnetic field created by said arrangement holds the glow between the electrode and the substrate without interfering with deposition onto the substrate;
   the improvement comprising that the magnets are arranged in a quasi-radial fashion provided by disposing magnets of varying length within the perimeter of the electrode assembly extending toward the center of said assembly, and so that the area of the magnets is distributed in a substantially proportional manner with respect to the area of the substrate to be coated, whereby a more uniform coating at a lower temperature and higher deposition rate is deposited.

8. The electrode assembly of claim 7 wherein the magnet arrangement is supported by two support plates of a material that will not readily sputter.

9. The electrode assembly of claim 7 wherein the electrode assembly is disc-shaped so as to accommodate disc-shaped substrates.

10. The glow discharge apparatus of claim 1 including means for rotating said substrate.

* * * * *